United States Patent
Choi et al.

(10) Patent No.: US 8,546,194 B2
(45) Date of Patent: Oct. 1, 2013

(54) INTEGRATED CIRCUIT PACKAGING SYSTEM WITH INTERCONNECTS AND METHOD OF MANUFACTURE THEREOF

(75) Inventors: JoonYoung Choi, Incheon (KR); YongHyuk Jeong, Kyungki-do (KR); DaeSik Choi, Seoul (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 13/325,903

(22) Filed: Dec. 14, 2011

(65) Prior Publication Data

US 2013/0157418 A1   Jun. 20, 2013

(51) Int. Cl.
*H01L 21/00* (2006.01)
*H01L 21/44* (2006.01)

(52) U.S. Cl.
USPC ........... 438/127; 438/109; 438/125; 438/126; 438/613; 257/775; 257/777; 257/787; 257/E23.175; 257/E23.178

(58) Field of Classification Search
USPC .................. 257/686, 777, E23.178, E23.175; 438/127, 613
See application file for complete search history.

(56) References Cited

U.S. PATENT DOCUMENTS

| | | | |
|---|---|---|---|
| 6,583,517 B1 | 6/2003 | Jimarez | |
| 7,777,351 B1 | 8/2010 | Berry et al. | |
| 7,993,941 B2 | 8/2011 | Huang et al. | |
| 2005/0242436 A1* | 11/2005 | Abe et al. | 257/737 |
| 2007/0207608 A1* | 9/2007 | Wang | 438/614 |
| 2008/0017968 A1* | 1/2008 | Choi et al. | 257/686 |
| 2009/0014871 A1* | 1/2009 | Meyer et al. | 257/737 |
| 2010/0171205 A1 | 7/2010 | Chen et al. | |
| 2010/0171207 A1* | 7/2010 | Shen et al. | 257/686 |
| 2011/0140259 A1 | 6/2011 | Cho et al. | |
| 2011/0149493 A1 | 6/2011 | Kwon et al. | |

OTHER PUBLICATIONS

U.S. Appl. No. 12/854,306, filed Aug. 11, 2010, Jang et al.
U.S. Appl. No. 13/149,669, filed May 31, 2011, Choi et al.
U.S. Appl. No. 13/163,643, filed Jun. 17, 2011, Yang et al.

* cited by examiner

*Primary Examiner* — Angel Roman
(74) *Attorney, Agent, or Firm* — Ishimaru & Associates LLP

(57) ABSTRACT

A method of manufacture of an integrated circuit packaging system includes: providing a base carrier; forming a conductive post on the base carrier, the conductive post having a top protrusion with a protrusion top side; mounting a base integrated circuit over the base carrier; and forming a base encapsulation over the base integrated circuit, the base encapsulation having an encapsulation top side and an encapsulation recess with the conductive post partially exposed within the encapsulation recess, the encapsulation top side above the protrusion top side.

20 Claims, 6 Drawing Sheets

INTEGRATED CIRCUIT PACKAGING SYSTEM WITH INTERCONNECTS AND METHOD OF MANUFACTURE THEREOF

TECHNICAL FIELD

The present invention relates generally to an integrated circuit packaging system, and more particularly to a system for an integrated circuit packaging system with interconnects.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration and cost reduction.

Thus, a need still remains for an integrated circuit packaging system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base carrier; forming a conductive post on the base carrier, the conductive post having a top protrusion with a protrusion top side; mounting a base integrated circuit over the base carrier; and forming a base encapsulation over the base integrated circuit, the base encapsulation having an encapsulation top side and an encapsulation recess with the conductive post partially exposed within the encapsulation recess, the encapsulation top side above the protrusion top side.

The present invention provides an integrated circuit packaging system, including: a base carrier; a conductive post on the base carrier, the conductive post having a top protrusion with a protrusion top side; a base integrated circuit over the base carrier; and a base encapsulation over the base integrated circuit, the base encapsulation having an encapsulation top side and an encapsulation recess with the conductive post partially exposed within the encapsulation recess, the encapsulation top side above the protrusion top side.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
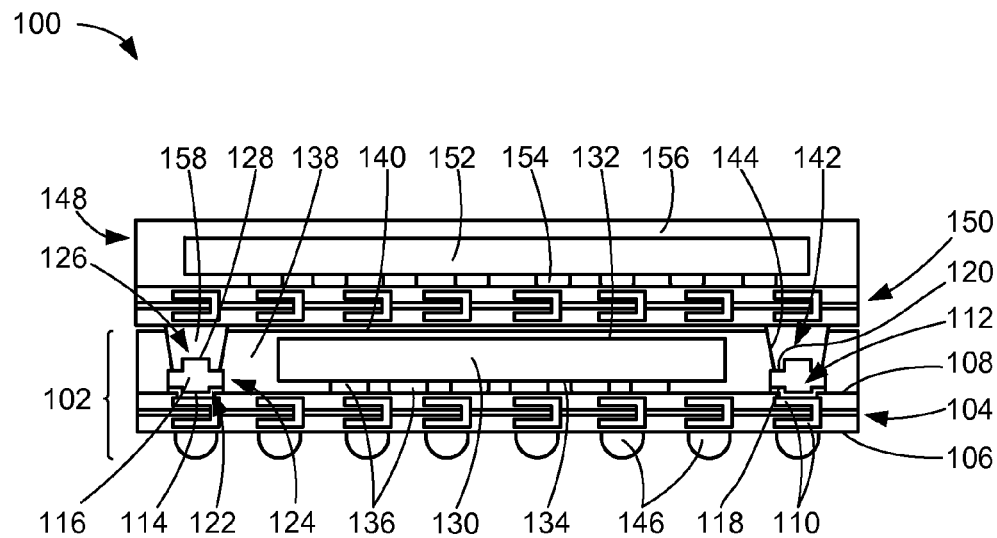
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
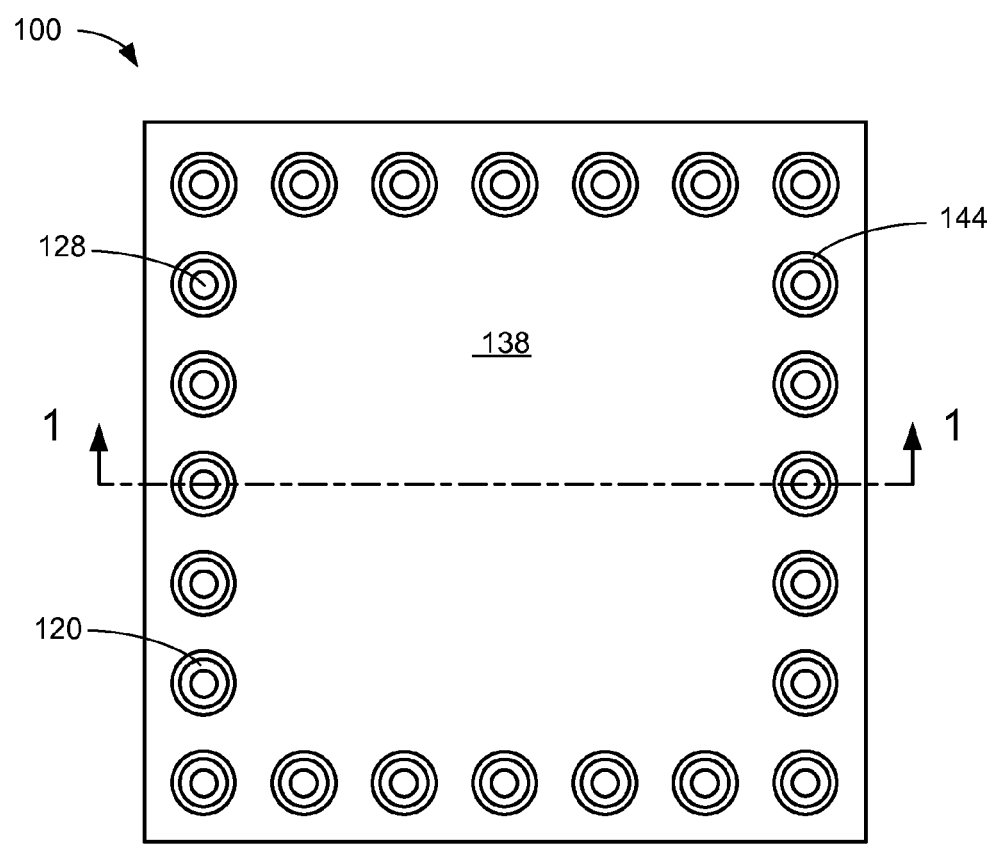
FIG. 2 is a top plan view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 include a molded laser package (MLP) structure using protruded metal posts to improve reliability.

The integrated circuit packaging system 100 can include a base package 102, which is defined as a semiconductor package. The base package 102 can include a base carrier 104, which is defined as a support structure for mounting and connecting an integrated circuit thereto including providing electrical connections through the support structure. For example, the base package 102 can represent a semiconductor package including a bottom package.

The base carrier 104 can include a carrier bottom side 106, a carrier top side 108, carrier pads 110, and carrier cavities 112. The carrier pads 110 are defined as electrically conductive contacts. The carrier cavities 112 are defined as openings at the carrier top side 108. The carrier pads 110 are partially exposed in the carrier cavities 112.

The base package 102 can optionally include a seed layer 114, which is defined as an electrically conductive structure. The seed layer 114 can be formed over portions of the carrier top side 108 that are adjacent the carrier cavities 112. The seed layer 114 can be formed over portions of the base carrier 104 within the carrier cavities 112. The seed layer 114 can be formed over portions of the carrier pads 110 that are exposed in the carrier cavities 112.

The base package 102 can include conductive posts 116, which are defined as electrically conductive connectors. The conductive posts 116 provide electrical connectivity between the base carrier 104 and a semiconductor package stacked thereon. For example, the conductive posts 116 can represent electrically conductive connectors including metal posts.

Each of the conductive posts 116 can include a lower surface 118 and an upper surface 120. Each of the conductive posts 116 can include a bottom protrusion 122, a body 124, and a top protrusion 126 having a protrusion top side 128. The bottom protrusion 122, the body 124, the top protrusion 126, or a combination thereof is formed as a single contiguous integral structure with the same material.

The bottom protrusion 122 can be directly below a central portion of the body 124. The bottom protrusion 122 and the body 124 can be directly on the seed layer 114. If the seed layer 114 is optionally not formed even with increased cost, the bottom protrusion 122 and the body 124 can be formed directly on portions of the carrier top side 108 that are closest to the carrier cavities 112 and directly on portions of the carrier pads 110 that are exposed in the carrier cavities 112. The top protrusion 126 can be directly over a central portion of the body 124.

The lower surface 118 is defined as a peripheral side of each of the conductive posts 116. The lower surface 118 is above a bottom extent of each of the conductive posts 116. The upper surface 120 is defined as a peripheral side of each of the conductive posts 116. The upper surface 120 is below a top extent of each of the conductive posts 116.

The bottom protrusion 122 is defined as a bottom portion of each of the conductive posts 116. The bottom protrusion 122 vertically extends downwardly from the body 124. The body 124 is a central portion of each of the conductive posts 116. The body 124 extends from the bottom protrusion 122 to the top protrusion 126. The top protrusion 126 is defined as a top portion of each of the conductive posts 116. The top protrusion 126 vertically extends upwardly from the body 124. The protrusion top side 128 is defined as a top extent of the top protrusion 126. The protrusion top side 128 is also a top extent of each of the conductive posts 116.

A horizontal width of the body 124 can be greater than a horizontal width of the bottom protrusion 122. A horizontal width of the body 124 can be greater than a horizontal width of the top protrusion 126.

For illustration purposes, a horizontal width of the bottom protrusion 122 is shown greater than a horizontal width of the top protrusion 126, although it is understood that the bottom protrusion 122 and the top protrusion 126 can include any widths with respect to each other. For example, a horizontal width of the bottom protrusion 122 can be approximately equal to a horizontal width of the top protrusion 126.

A vertical height of the body 124 can be greater than a vertical height of the bottom protrusion 122, a vertical height of the top protrusion 126, or a combination thereof. A vertical height of the top protrusion 126 can be greater than a vertical height of the bottom protrusion 122.

Horizontal widths of the bottom protrusion 122, the body 124, and the top protrusion 126 are defined as horizontal distances between non-horizontal extents of the bottom protrusion 122, the body 124, and the top protrusion 126, respectively. Vertical heights of the bottom protrusion 122, the body 124, and the top protrusion 126 are defined as vertical distances between non-vertical extents of the bottom protrusion 122, the body 124, and the top protrusion 126, respectively.

The base package 102 can include a base integrated circuit 130, which is defined as a semiconductor device having a number of integrated transistors interconnected to form active circuits. The base integrated circuit 130 can include a base inactive side 132 and a base active side 134.

The base integrated circuit 130 can be mounted over the carrier top side 108. The base active side 134 can be facing the carrier top side 108. The base integrated circuit 130 can be surrounded by the conductive posts 116. For example, the base integrated circuit 130 can represent a semiconductor device including an integrated circuit die, a wirebond integrated circuit, or a flip chip.

The base package 102 can include base connectors 136, which are defined as electrically conductive connectors. The base connectors 136 can be attached to the carrier top side 108 and the base active side 134. For example, the base connectors 136 can represent electrically conductive connectors including conductive bumps or bond wires.

The base package 102 can include a base encapsulation 138, which is defined as a package cover of the semiconductor package to hermetically seal the semiconductor device providing mechanical and environmental protection. The base encapsulation 138 can be formed over the carrier top side 108, the seed layer 114, the conductive posts 116, the base integrated circuit 130, and the base connectors 136.

The base encapsulation 138 can include an encapsulation top side 140, an encapsulation recess 142, and a recess sidewall 144. The encapsulation top side 140 is defined as a top extent of the base encapsulation 138. The encapsulation recess 142 is defined as an indentation of the base encapsulation 138. The recess sidewall 144 is defined as a surface of the base encapsulation 138 that horizontally bounds the encapsulation recess 142.

The conductive posts 116 can be partially exposed from the base encapsulation 138. The conductive posts 116 can be partially exposed within the encapsulation recess 142. The upper surface 120 and the protrusion top side 128 can be exposed from the base encapsulation 138 within the encapsulation recess 142. The upper surface 120 and the protrusion top side 128 can include planar or flat surfaces. The protrusion top side 128 can be below the encapsulation top side 140. The encapsulation recess 142 can be wider near the encapsulation top side 140 than near the conductive posts 116.

The base package 102 can include base external connectors 146, which are defined as electrically conductive connectors. The base external connectors 146 can be attached to the carrier bottom side 106 and an external system (not shown). The base external connectors 146 can represent electrically conductive connectors including conductive balls.

The integrated circuit packaging system 100 can include a stack package 148, which is defined as a semiconductor package. The stack package 148 can include a stack carrier 150, a stack integrated circuit 152, stack connectors 154, a stack encapsulation 156, and stack external connectors 158. For example, the stack package 148 can represent a semiconductor package including a top package.

The stack carrier 150 is defined as a support structure for mounting and connecting an integrated circuit thereto including providing electrical connections through the support structure. The stack integrated circuit 152 is defined as a semiconductor device having a number of integrated transistors interconnected to form active circuits.

The stack connectors 154 are defined as electrically conductive connectors. The stack encapsulation 156 is defined as a package cover of the semiconductor package to hermetically seal the semiconductor device providing mechanical and environmental protection. The stack external connectors 158 are defined as electrically conductive connectors.

The stack integrated circuit 152 can be mounted over a top extent of the stack carrier 150. The stack connectors 154 can be attached to a top extent of the stack carrier 150 and an active side of the stack integrated circuit 152. The stack encapsulation 156 can be formed over a top extent of the stack carrier 150, the stack integrated circuit 152, and the stack connectors 154. The stack external connectors 158 can be attached to a bottom extent of the stack carrier 150.

The stack package 148 can be mounted over the base package 102. The stack external connectors 158 can be attached to the conductive posts 116 within the carrier cavities 112. The stack external connectors 158 can be directly on the upper surface 120 and the protrusion top side 128.

The cross-sectional view depicts a shape of the stack external connectors 158 after a reflow process. After the reflow process, the stack external connectors 158 can conform to contours of the upper surface 120, the protrusion top side 128, and the recess sidewall 144. The stack external connectors 158 can completely fill the encapsulation recess 142.

It has been discovered that the conductive posts 116 provide improved reliability with each of the conductive posts 116 having the top protrusion 126 as a protruded post structure instead of a bump or stack stud bump structure on a substrate of a bottom semiconductor package of a conventional molded laser package (MLP) system since the protruded post structure improves solder joint strength and wettability by providing increased contact area and mechanical locking when the protruded post structure is attached to the stack package 148.

It has also been discovered that the conductive posts 116, each having the top protrusion 126, provide improved reliability by providing improved alignment and eliminating snowball effect because metal posts do not collapse and thus are applicable in packaging systems with a molded laser package (MLP) for which material attached to a top package (PKG) and a bottom package (PKG) is important because of reliability issues, such as problems with misalignment and snowball effect due to narrow inner holes of the bottom package.

It has further been discovered that the conductive posts 116 provide fine pitch with pitch reduction thereby providing package size reduction of the integrated circuit packaging system 100 compared to packaging systems with exposed solder balls as interconnects.

It has further been discovered that the upper surface 120 and the protrusion top side 128 having planar surfaces provide improved reliability with the upper surface 120 and the protrusion top side 128 rinsed after laser ablation thereby eliminating mold flash problems due to contamination with mold flash on metal posts that cause difficulty to interconnect bottom and top semiconductor packages (PKG).

It has further been discovered that the body 124 provides improved reliability by providing a robust structure with a horizontal width of the body 124 greater than a horizontal width of the bottom protrusion 122 and a horizontal width of the top protrusion 126.

It has further been discovered that the bottom protrusion 122 provides improved reliability with a horizontal width of the bottom protrusion 122 greater than or approximately equal to a horizontal width of the top protrusion 126 so that the bottom protrusion 122 is firmly formed directly on the seed layer 114 resulting in a robust support structure for stacking the stack package 148.

It has further been discovered that the body 124 provides improved reliability with a vertical height of the body 124 greater than a vertical height of the bottom protrusion 122, a vertical height of the top protrusion 126, or a combination thereof so that each of the conductive posts 116 has a robust support structure for stacking the stack package 148.

It has further been discovered that the top protrusion 126 provides improved reliability with a vertical height of the top protrusion 126 greater than a vertical height of the bottom protrusion 122 resulting in increased contact area thereby providing improved solder joint strength and improved wettability with a stable and reliable interconnect structure for attaching the stack external connectors 158 to the conductive posts 116.

Referring now to FIG. 2, therein is shown a top plan view of the integrated circuit packaging system 100. The top plan view depicts the integrated circuit packaging system 100 without the stack package 148 of FIG. 1. The upper surface 120 and the protrusion top side 128 can be exposed from the base encapsulation 138. The upper surface 120 and the protrusion top side 128 can be surrounded by the recess sidewall 144.

For illustration purposes, the upper surface 120 and the recess sidewall 144 are shown with circular shapes, although it is understood that the upper surface 120 and the recess sidewall 144 can include any other shapes. For example, the upper surface 120 and the recess sidewall 144 can include rectangular shapes.

Figure 3:
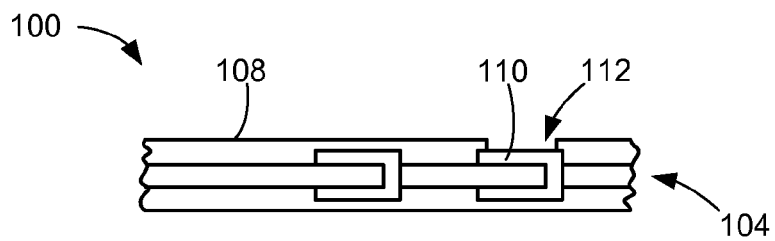
FIG. 3 is a cross-sectional view of a portion of the integrated circuit packaging system in a carrier-provision phase of manufacture.

Referring now to FIG. 3, therein is shown a cross-sectional view of a portion of the integrated circuit packaging system 100 in a carrier-provision phase of manufacture. The carrier-provision phase can represent a phase in a substrate process flow.

The cross-sectional view depicts the base carrier 104 provided with the carrier pads 110 exposed within the carrier cavities 112 at the carrier top side 108. The base carrier 104 can include a number of layers of insulation and conductive materials to provide electrical connections through the base carrier 104.

Figure 4:
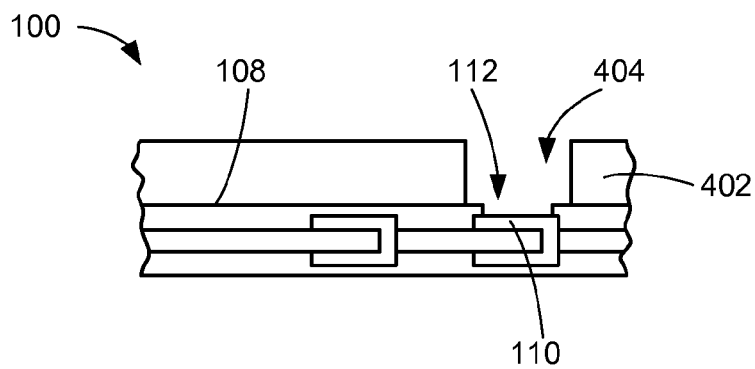
FIG. 4 is the structure of FIG. 3 in a first mask-formation phase.

Referring now to FIG. 4, therein is shown the structure of FIG. 3 in a first mask-formation phase. The integrated circuit packaging system 100 can include a protection mask 402, which is defined as a layer of an insulation material.

The protection mask 402 can be deposited on the base carrier 104. The protection mask 402 can be deposited with a mask-formation process including physical vapor deposition (PVD) coating, chemical vapor deposition (CVD) coating, printing, spin coating, spray coating, sintering, or thermal oxidation. The protection mask 402 can be partially removed by a mask-removal process including patterning or exposure to ultra-violet light. The protection mask 402 can represent a layer of an insulation material including solder resist or a photosensitive material.

The protection mask 402 can be formed over the carrier top side 108. The protection mask 402 can be formed with first holes 404 exposing portions of the carrier top side 108 that surround the carrier pads 110 and the carrier cavities 112.

Figure 5:
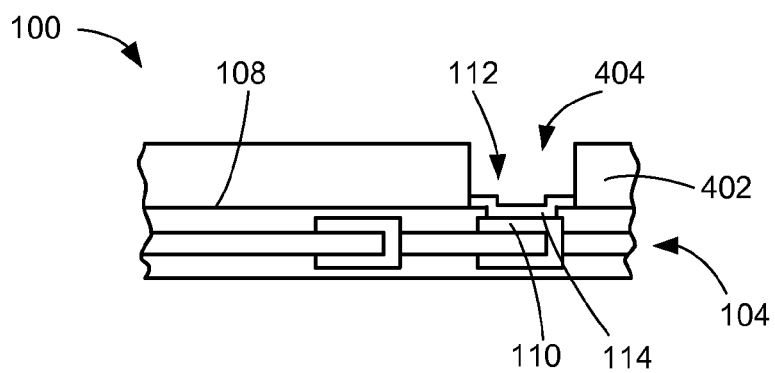
FIG. 5 is the structure of FIG. 4 in a seed-deposition phase.

Referring now to FIG. 5, therein is shown the structure of FIG. 4 in a seed-deposition phase. The seed layer 114 can be formed with a seed-deposition process including electroplating or electroless plating. The seed layer 114 can be formed with an electrically conductive material including aluminum (Al), copper (Cu), tin (Sn), nickel (Ni), gold (Au), silver (Ag), any other metals, a metallic alloy, or a combination thereof.

The seed layer 114 can be formed over portions of the carrier top side 108 within the first holes 404. The seed layer 114 can be formed over the carrier pads 110 that are exposed in the carrier cavities 112. The seed layer 114 can conform to contours of the base carrier 104 and the protection mask 402.

Figure 6:
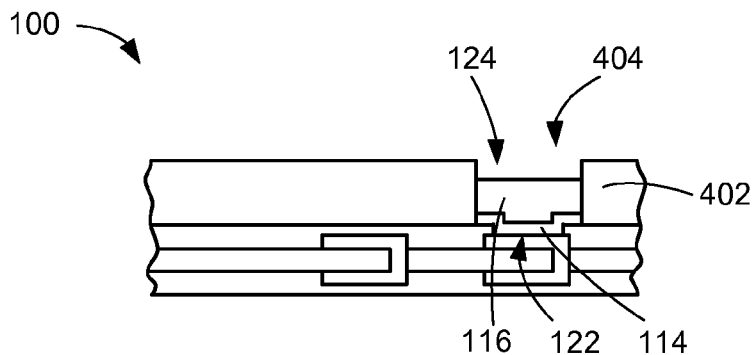
FIG. 6 is the structure of FIG. 5 in a first conductor-formation phase.

Referring now to FIG. 6, therein is shown the structure of FIG. 5 in a first conductor-formation phase. The conductive posts 116 can be deposited with a conductor-formation process including electroplating. The conductive posts 116 can be formed with an electrically conductive material including nickel (Ni), palladium (Pd), gold (Au), any other metals, a metallic alloy, or a combination thereof.

The conductive posts 116 can be formed with the bottom protrusion 122 and the body 124 directly on the seed layer 114. The bottom protrusion 122 can conform to a contour of the seed layer 114. The body 124 can conform to contours of the seed layer 114 and the protection mask 402 within the first holes 404. The bottom protrusion 122 and the body 124 are formed with a single contiguous integral structure with the same material.

Figure 7:
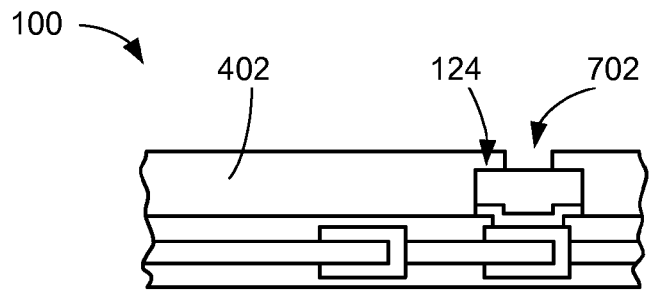
FIG. 7 is the structure of FIG. 6 in a second mask-formation phase.

Referring now to FIG. 7, therein is shown the structure of FIG. 6 in a second mask-formation phase. The protection mask 402 can be formed with an additional insulation material by a mask-formation process including patterning or exposure to ultra-violet light. The protection mask 402 can be formed with an additional insulation material by a mask-formation process including physical vapor deposition (PVD) coating, chemical vapor deposition (CVD) coating, printing, spin coating, spray coating, sintering, or thermal oxidation. The additional insulation material can represent an insulation material including solder resist or a photosensitive material.

The protection mask 402 can be formed with the additional insulation material directly on a top extent of the body 124. The protection mask 402 can be formed with the additional insulation material to reduce a horizontal distance between non-horizontal sides of the protection mask 402 that horizontally bound the first holes 404 of FIG. 4 to form second holes 702 of the protection mask 402.

Figure 8:
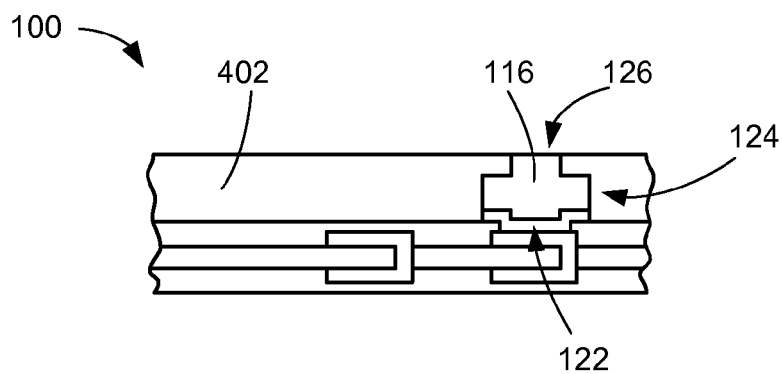
FIG. 8 is the structure of FIG. 7 in a second conductor-formation phase.

Referring now to FIG. 8, therein is shown the structure of FIG. 7 in a second conductor-formation phase. The conductive posts 116 can be formed with the top protrusion 126 directly on the body 124 exposed from the protection mask 402 within the second holes 702 of FIG. 7.

The top protrusion 126 can be formed with a conductor-formation process including electroplating. The top protrusion 126 can be formed with an electrically conductive material including nickel (Ni), palladium (Pd), gold (Au), any other metals, a metallic alloy, or a combination thereof. The top protrusion 126 can be formed with the same material as that used to form the bottom protrusion 122 and the body 124 in FIG. 6.

Figure 9:
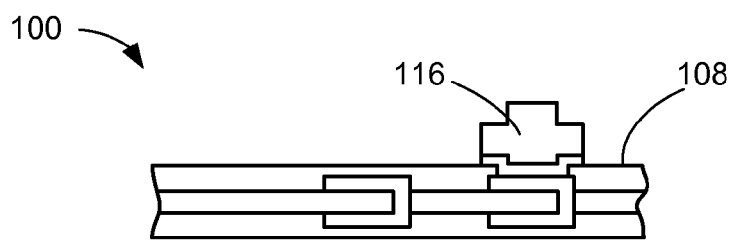
FIG. 9 is the structure of FIG. 8 in a mask-removal phase.

Referring now to FIG. 9, therein is shown the structure of FIG. 8 in a mask-removal phase. The protection mask 402 of FIG. 8 can be removed to expose portions of the conductive posts 116 and the carrier top side 108.

Figure 10:
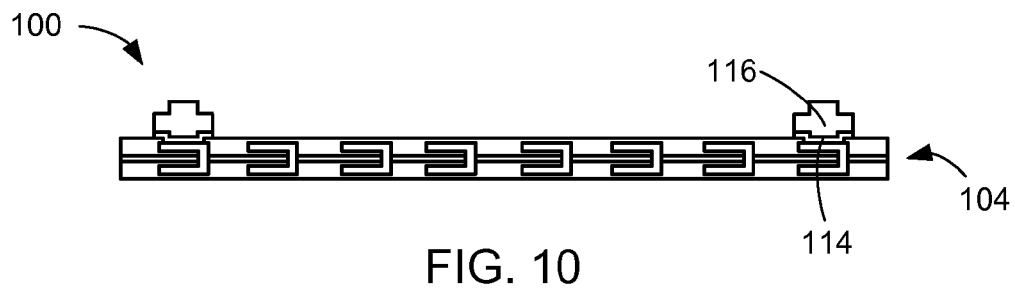
FIG. 10 is the structure of FIG. 9 in a carrier-provision phase.

Referring now to FIG. 10, therein is shown the structure of FIG. 9 in a carrier-provision phase. The carrier-provision phase can represent a phase in an assembly process flow. FIG.

10 depicts the base carrier 104 provided with the conductive posts 116 directly on the seed layer 114.

Figure 11:
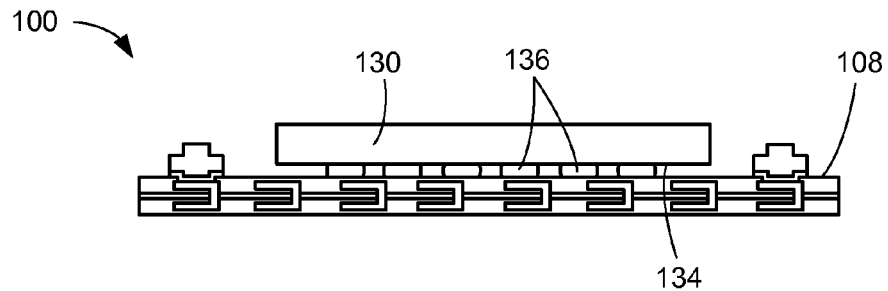
FIG. 11 is the structure of FIG. 10 in a first mounting phase.

Referring now to FIG. 11, therein is shown the structure of FIG. 10 in a first mounting phase. The base integrated circuit 130 can be mounted over the carrier top side 108 with the base connectors 136 attached to the carrier top side 108 and the base active side 134.

Figure 12:
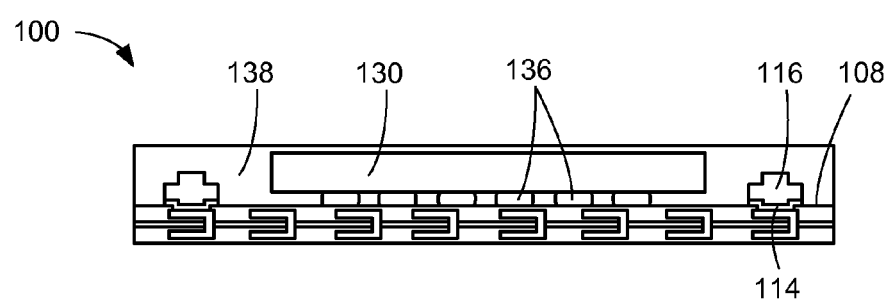
FIG. 12 is the structure of FIG. 11 in a molding phase.

Referring now to FIG. 12, therein is shown the structure of FIG. 11 in a molding phase. The base encapsulation 138 can be formed to cover portions of the carrier top side 108, the seed layer 114, the conductive posts 116, the base integrated circuit 130, and the base connectors 136.

Figure 13:
FIG. 13 is the structure of FIG. 12 in an encapsulation-removal phase.

Referring now to FIG. 13, therein is shown the structure of FIG. 12 in an encapsulation-removal phase. The base encapsulation 138 can be partially removed to form the encapsulation recess 142 bounded by the recess sidewall 144. The conductive posts 116 can be partially exposed from the base encapsulation 138 within the encapsulation recess 142.

The base encapsulation 138 can be partially removed with an encapsulation-removal process including laser and etching. The upper surface 120 and the protrusion top side 128 can include a physical feature including a shallow cavity, a recess, a micro recess, a laser-ablated mark, or other physical removal marks, characteristic of the base encapsulation 138 partially removed.

Figure 14:
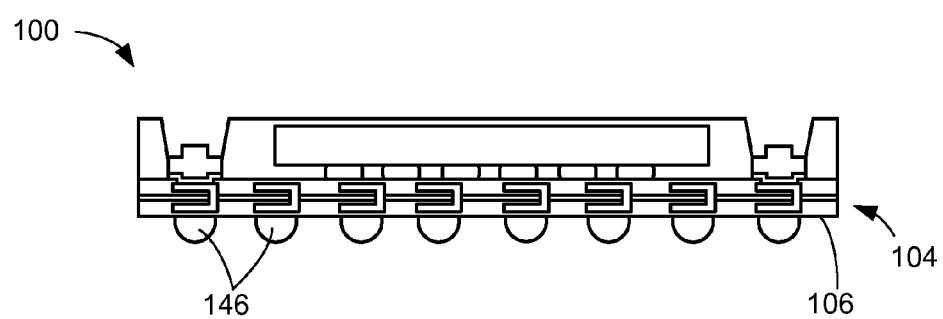
FIG. 14 is the structure of FIG. 13 in an attachment phase.

Referring now to FIG. 14, therein is shown the structure of FIG. 13 in an attachment phase. The base external connectors 146 can be attached to the carrier bottom side 106 to provide electrical connectivity between the base carrier 104 and the external system.

Figure 15:
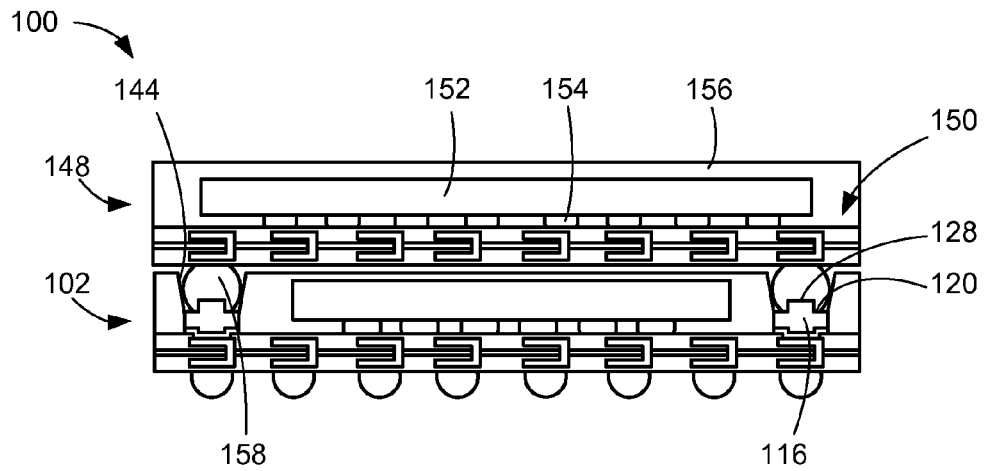
FIG. 15 is the structure of FIG. 14 in a second mounting phase.

Referring now to FIG. 15, therein is shown the structure of FIG. 14 in a second mounting phase. The stack package 148 having the stack carrier 150, the stack integrated circuit 152, the stack connectors 154, and the stack encapsulation 156 can be mounted over the base package 102. The stack external connectors 158 of the stack package 148 can be attached to the conductive posts 116.

The integrated circuit packaging system 100 can include the reflow process to form the structure of FIG. 1. After the reflow process, the stack external connectors 158 can conform to contours of the upper surface 120, the protrusion top side 128, and the recess sidewall 144.

Figure 16:
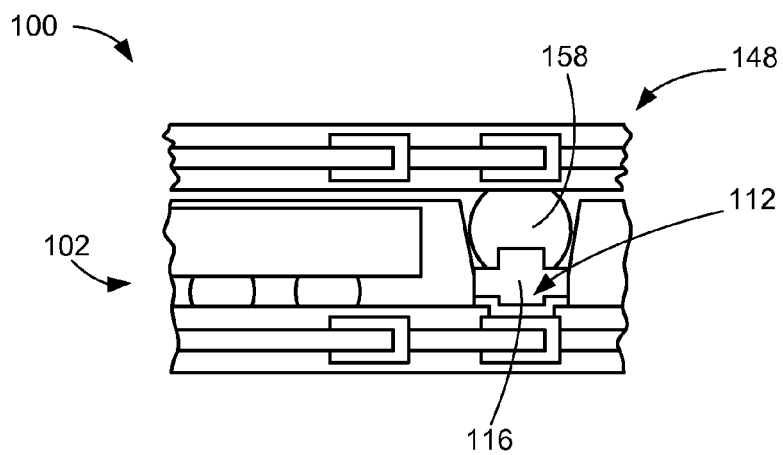
FIG. 16 is a detail cross-sectional view of a portion of the structure of FIG. 15.

Referring now to FIG. 16, therein is shown a detail cross-sectional view of a portion of the structure of FIG. 15. The detail cross-sectional view depicts the stack package 148 mounted over the base package 102 before the reflow process. The stack external connectors 158 can be attached to the conductive posts 116 within the carrier cavities 112.

Figure 17:
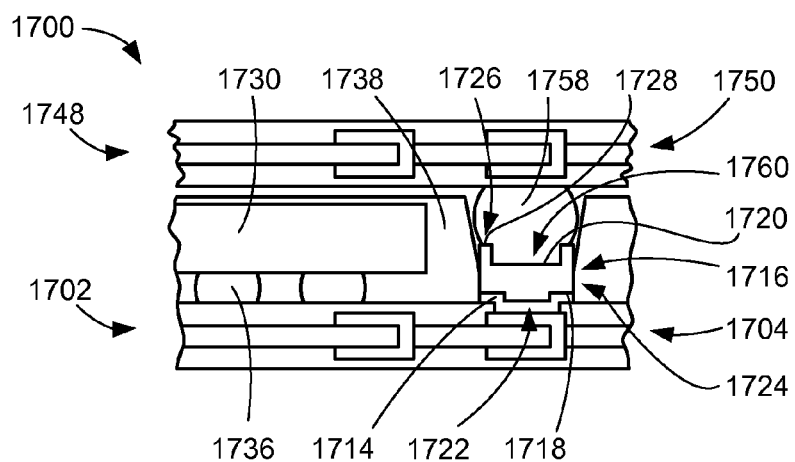
FIG. 17 is a cross-sectional view of an integrated circuit packaging system in a second embodiment of the present invention.

Referring now to FIG. 17, therein is shown a cross-sectional view of an integrated circuit packaging system 1700 in a second embodiment of the present invention. The cross-sectional view depicts a structure of the integrated circuit packaging system 1700 before a reflow process.

In a manner similar to the integrated circuit packaging system 100 of FIG. 1, the integrated circuit packaging system 1700 includes a base package 1702 with a base carrier 1704 and a seed layer 1714. In a manner similar to the integrated circuit packaging system 100, the base package 1702 includes conductive posts 1716, each having a lower surface 1718, an upper surface 1720, a bottom protrusion 1722, a body 1724, and a top protrusion 1726 with a protrusion top side 1728.

In a manner similar to the integrated circuit packaging system 100, the base package 1702 includes a base integrated circuit 1730 and base connectors 1736. In a manner similar to the integrated circuit packaging system 100, the base package 1702 includes a base encapsulation 1738. In a manner similar to the integrated circuit packaging system 100, the integrated circuit packaging system 1700 includes a stack package 1748 having a stack carrier 1750 and stack external connectors 1758.

The top protrusion 1726 can be directly over a periphery portion of the body 1724. The top protrusion 1726 can vertically extend along a non-horizontal extent of the body 1724. A non-horizontal extent of the top protrusion 1726 can be coplanar with a non-horizontal extent of the body 1724.

Each of the conductive posts 1716 can include a post recess 1760, which is defined as an indentation. The post recess 1760 can be at the protrusion top side 1728. The post recess 1760 can be horizontally bounded by the top protrusion 1726. The post recess 1760 can be vertically bounded by the upper surface 1720.

It has been discovered that the conductive posts 1716 provide improved reliability with each of the conductive posts 1716 having the top protrusion 1726 as a protruded post structure instead of a bump or stack stud bump structure on a substrate of a bottom semiconductor package of a conventional molded laser package (MLP) system since the protruded post structure improves solder joint strength and wettability by providing increased contact area and mechanical locking when the protruded post structure is attached to the stack package 1748.

It has also been discovered that the conductive posts 1716, each having the top protrusion 1726, provide improved reliability by eliminating snowball effect because metal posts do not collapse.

It has further been discovered that the conductive posts 1716 provide fine pitch with pitch reduction thereby providing package size reduction of the integrated circuit packaging system 1700 compared to packaging systems with exposed solder balls as interconnects.

It has further been discovered that the upper surface 1720 and the protrusion top side 1728 having planar surfaces provide improved reliability with the upper surface 1720 and the protrusion top side 1728 rinsed after laser ablation thereby eliminating mold flash problems due to contamination with mold flash on metal posts that cause difficulty to interconnect bottom and top semiconductor packages (PKG).

It has further been discovered that the body 1724 provides improved reliability by providing a robust structure with a horizontal width of the body 1724 greater than a horizontal width of the bottom protrusion 1722 and a horizontal width of the top protrusion 1726.

It has further been discovered that the bottom protrusion 1722 provides improved reliability with a horizontal width of the bottom protrusion 1722 greater than a horizontal width of the top protrusion 1726 so that the bottom protrusion 1722 is firmly formed directly on the seed layer 1714 resulting in a robust support structure for stacking the stack package 1748.

It has further been discovered that the body 1724 provides improved reliability with a vertical height of the body 1724 greater than a vertical height of the bottom protrusion 1722, a vertical height of the top protrusion 1726, or a combination thereof so that each of the conductive posts 1716 has a robust support structure for stacking the stack package 1748.

It has further been discovered that the top protrusion 1726 provides improved reliability with a vertical height of the top protrusion 1726 greater than a vertical height of the bottom protrusion 1722 resulting in increased contact area thereby providing improved solder joint strength and improved wettability with a stable and reliable interconnect structure for attaching the stack external connectors 1758 to the conductive posts 1716.

Figure 18:
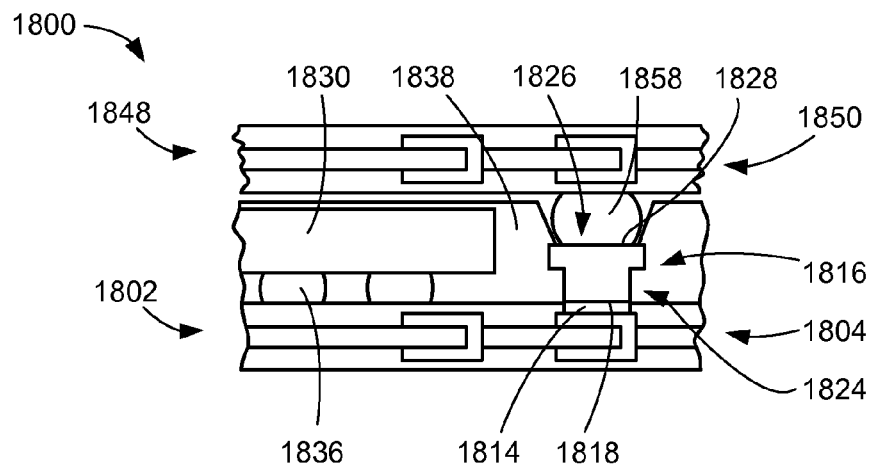
FIG. 18 is a cross-sectional view of an integrated circuit packaging system in a third embodiment of the present invention.

Referring now to FIG. 18, therein is shown a cross-sectional view of an integrated circuit packaging system 1800 in a third embodiment of the present invention. The cross-sectional view depicts a structure of the integrated circuit packaging system 1800 before a reflow process.

In a manner similar to the integrated circuit packaging system 100 of FIG. 1, the integrated circuit packaging system 1800 includes a base package 1802 with a base carrier 1804 and a seed layer 1814. In a manner similar to the integrated circuit packaging system 100, the base package 1802 includes conductive posts 1816, each having a lower surface 1818, a body 1824, and a top protrusion 1826 with a top protrusion top side 1828.

In a manner similar to the integrated circuit packaging system 100, the base package 1802 includes a base integrated circuit 1830 and base connectors 1836. In a manner similar to the integrated circuit packaging system 100, the base package 1802 includes a base encapsulation 1838. In a manner similar to the integrated circuit packaging system 100, the integrated circuit packaging system 1800 includes a stack package 1848 having a stack carrier 1850 and stack external connectors 1858.

The top protrusion 1826 can be over the body 1824. The top protrusion 1826 can horizontally extend beyond a non-horizontal extent of the body 1824. A horizontal width of the top protrusion 1826 can be greater than a horizontal width of the body 1824.

It has been discovered that the conductive posts 1816 provide improved reliability with each of the conductive posts 1816 having the top protrusion 1826 as a protruded post structure instead of a bump or stack stud bump structure on a substrate of a bottom semiconductor package of a conventional molded laser package (MLP) system since the protruded post structure improves solder joint strength and wettability by providing increased contact area and mechanical locking when the protruded post structure is attached to the stack package 1848.

It has also been discovered that the conductive posts 1816, each having the top protrusion 1826, provide improved reliability by eliminating snowball effect because metal posts do not collapse.

It has further been discovered that the conductive posts 1816 provide fine pitch with pitch reduction thereby providing package size reduction of the integrated circuit packaging system 1800 compared to packaging systems with exposed solder balls as interconnects.

It has further been discovered that the top protrusion top side 1828 having a planar surface provides improved reliability with the top protrusion top side 1828 rinsed after laser ablation thereby eliminating mold flash problems due to contamination with mold flash on metal posts that cause difficulty to interconnect bottom and top semiconductor packages (PKG).

It has further been discovered that the body 1824 provides improved reliability with a vertical height of the body 1824 greater than a vertical height of the top protrusion 1826 so that each of the conductive posts 1816 has a robust support structure for stacking the stack package 1848.

It has further been discovered that the top protrusion 1826 provides improved reliability with the top protrusion 1826 horizontally extending beyond a non-horizontal extent of the body 1824 and with a horizontal width of the top protrusion 1826 greater than a horizontal width of the body 1824 resulting in improved mold lock.

Figure 19:
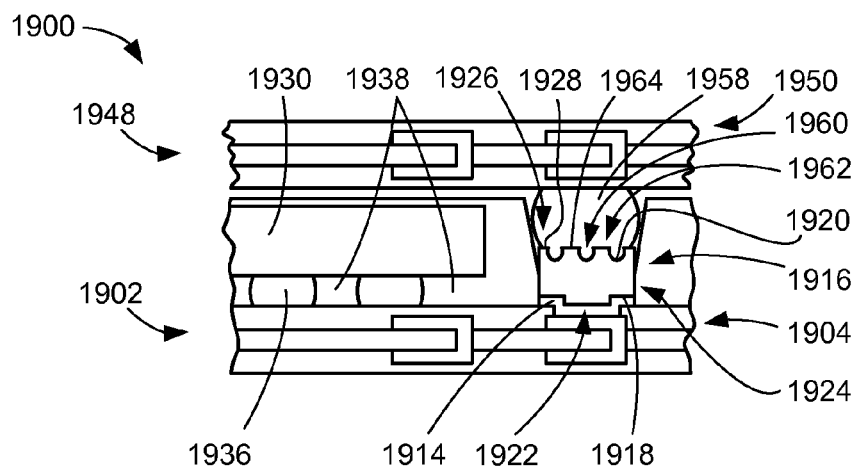
FIG. 19 is a cross-sectional view of an integrated circuit packaging system in a fourth embodiment of the present invention.

Referring now to FIG. 19, therein is shown a cross-sectional view of an integrated circuit packaging system 1900 in a fourth embodiment of the present invention. The cross-sectional view depicts a structure of the integrated circuit packaging system 1900 before a reflow process.

In a manner similar to the integrated circuit packaging system 100 of FIG. 1, the integrated circuit packaging system 1900 includes a base package 1902 with a base carrier 1904 and a seed layer 1914. In a manner similar to the integrated circuit packaging system 100, the base package 1902 includes conductive posts 1916, each having a lower surface 1918, an upper surface 1920, a bottom protrusion 1922, a body 1924, and a top protrusion 1926 with a top protrusion top side 1928.

In a manner similar to the integrated circuit packaging system 100, the base package 1902 includes a base integrated circuit 1930 and base connectors 1936. In a manner similar to the integrated circuit packaging system 100, the base package 1902 includes a base encapsulation 1938. In a manner similar to the integrated circuit packaging system 100, the integrated circuit packaging system 1900 includes a stack package 1948 having a stack carrier 1950 and stack external connectors 1958.

The top protrusion 1926 can be directly over a periphery portion of the body 1924. The top protrusion 1926 can vertically extend along a non-horizontal extent of the body 1924. A non-horizontal extent of the top protrusion 1926 can be coplanar with a non-horizontal extent of the body 1924.

Each of the conductive posts 1916 can include a post recess 1960, which is defined as an indentation. Each of the conductive posts 1916 can include interior protrusions 1962, each having an interior protrusion top side 1964. The interior protrusion top side 1964 can be coplanar with the top protrusion top side 1928. The interior protrusions 1962 can be completely horizontally surrounded by the top protrusion 1926.

The post recess 1960 can be at the top protrusion top side 1928 and the interior protrusion top side 1964. The post recess 1960 can be horizontally bounded by the top protrusion 1926 and the interior protrusions 1962. The post recess 1960 can be vertically bounded by the upper surface 1920. The post recess 1960 can be between the top protrusion 1926 and the interior protrusions 1962 or between the interior protrusions 1962.

It has been discovered that the conductive posts 1916 provide improved reliability with each of the conductive posts 1916 having the top protrusion 1926 and the interior protrusions 1962 as protruded post structures instead of a bump or stack stud bump structure on a substrate of a bottom semiconductor package of a conventional molded laser package (MLP) system since the protruded post structure improves solder joint strength and wettability by providing increased contact area and mechanical locking when the protruded post structure is attached to the stack package 1948.

It has also been discovered that the conductive posts 1916, each having the top protrusion 1926 and the interior protrusions 1962, provide improved reliability by eliminating snowball effect because metal posts do not collapse.

It has further been discovered that the conductive posts 1916 provide fine pitch with pitch reduction thereby providing package size reduction of the integrated circuit packaging system 1900 compared to packaging systems with exposed solder balls as interconnects.

It has further been discovered that the upper surface 1920, the top protrusion top side 1928, and the interior protrusion top side 1964 having planar surfaces provide improved reliability with the upper surface 1920, the top protrusion top side 1928, and the interior protrusion top side 1964 rinsed after laser ablation thereby eliminating mold flash problems due to contamination with mold flash on metal posts that cause difficulty to interconnect bottom and top semiconductor packages (PKG).

It has further been discovered that the body 1924 provides improved reliability with a vertical height of the body 1924 greater than vertical heights of the top protrusion 1926 and the interior protrusions 1962 so that each of the conductive posts 1916 has a robust support structure for stacking the stack package 1948.

It has further been discovered that the upper surface 1920, the top protrusion top side 1928, and the interior protrusions 1962 provide improved reliability by providing increased surface area for attaching the stack external connectors thereto resulting in improved mold lock.

Figure 20:
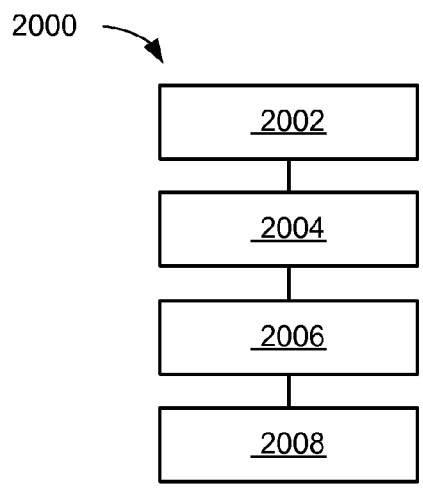
FIG. 20 is a flow chart of a method of manufacture of the integrated circuit packaging system in a further embodiment of the present invention.

Referring now to FIG. 20, therein is shown a flow chart of a method 2000 of manufacture of the integrated circuit packaging system 100 in a further embodiment of the present invention. The method 2000 includes: providing a base carrier in a block 2002; forming a conductive post on the base carrier, the conductive post having a top protrusion with a protrusion top side in a block 2004; mounting a base integrated circuit over the base carrier in a block 2006; and forming a base encapsulation over the base integrated circuit, the base encapsulation having an encapsulation top side and an encapsulation recess with the conductive post partially exposed within the encapsulation recess, the encapsulation top side above the protrusion top side in a block 2008.

Thus, it has been discovered that the integrated circuit packaging system of the present invention furnishes important and heretofore unknown and unavailable solutions, capabilities, and functional aspects for an integrated circuit packaging system with interconnects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a base carrier having a carrier pad;
   forming a conductive post on the carrier pad of the base carrier, the conductive post having a top protrusion with a protrusion top side and the conductive post for forming an electrolytic bond with the carrier pad;
   mounting a base integrated circuit over the base carrier;
   forming a base encapsulation over the base integrated circuit, the base encapsulation having an encapsulation top side and an encapsulation recess with the conductive post partially exposed within the encapsulation recess, the encapsulation recess wider near the encapsulation top side than near the conductive post, and the encapsulation top side above the protrusion top side; and
   forming a stack external connector completely filling and conforming to the contours of encapsulation recess and the top protrusion.

2. The method as claimed in claim 1 further comprising forming a seed layer over the base carrier.

3. The method as claimed in claim 1 wherein forming the conductive post includes forming the conductive post having a post recess at the protrusion top side.

4. The method as claimed in claim 1 wherein forming the conductive post includes forming the conductive post having a body with the top protrusion horizontally extending beyond a non-horizontal extent of the body.

5. The method as claimed in claim 1 wherein forming the conductive post includes forming the conductive post with a body having a non-horizontal extent coplanar with a non-horizontal extent of the top protrusion.

6. A method of manufacture of an integrated circuit packaging system comprising:
   providing a base carrier having a carrier pad;
   forming a conductive post on the carrier pad of the base carrier, the conductive post having a top protrusion with a protrusion top side and the conductive post for forming an electrolytic bond with the carrier pad;
   mounting a base integrated circuit over the base carrier;
   forming a base encapsulation over the base integrated circuit, the base encapsulation having an encapsulation top side and an encapsulation recess with the protrusion top side partially exposed within the encapsulation recess, the encapsulation recess wider near the encapsulation top side than near the conductive post, and the encapsulation top side above the protrusion top side; and
   forming a stack external connector completely filling and conforming to the contours of encapsulation recess and the top protrusion.

7. The method as claimed in claim 6 further comprising forming a seed layer over portions of the carrier pad of the base carrier.

8. The method as claimed in claim 6 wherein forming the conductive post includes forming the conductive post having a post recess at the protrusion top side, the post recess horizontally bounded by the top protrusion.

9. The method as claimed in claim 6 wherein forming the conductive post includes forming the conductive post having a body with the top protrusion horizontally extending beyond a non-horizontal extent of the body, a horizontal width of the top protrusion greater than a horizontal width of the body.

10. The method as claimed in claim 6 wherein forming the conductive post includes forming the conductive post with a body and an interior protrusion, the body having a non-horizontal extent coplanar with a non-horizontal extent of the top protrusion, the interior protrusion having an interior protrusion top side coplanar with the top protrusion top side.

11. An integrated circuit packaging system comprising:
    a base carrier having a carrier pad;
    a conductive post on the carrier pad of the base carrier, the conductive post having a top protrusion with a protrusion top side and the conductive post for forming an electrolytic bond with the carrier pad;
    a base integrated circuit over the base carrier;
    a base encapsulation over the base integrated circuit, the base encapsulation having an encapsulation top side and an encapsulation recess with the conductive post partially exposed within the encapsulation recess, the encapsulation recess wider near the encapsulation top side than near the conductive post, and the encapsulation top side above the protrusion top side; and a stack external connector completely filling and conforming to the contours of encapsulation recess and the top protrusion.

12. The system as claimed in claim 11 further comprising a seed layer over the base carrier.

13. The system as claimed in claim 11 wherein the conductive post includes a post recess at the protrusion top side.

14. The system as claimed in claim 11 wherein the conductive post includes a body with the top protrusion horizontally extending beyond a non-horizontal extent of the body.

15. The system as claimed in claim 11 wherein the conductive post includes a body having a non-horizontal extent coplanar with a non-horizontal extent of the top protrusion.

16. The system as claimed in claim 11 wherein the base encapsulation includes the encapsulation recess with the protrusion top side partially exposed within the encapsulation recess.

17. The system as claimed in claim 16 further comprising a seed layer over portions of the carrier pad of the base carrier.

18. The system as claimed in claim 16 wherein the conductive post includes a post recess at the protrusion top side, the post recess horizontally bounded by the top protrusion.

19. The system as claimed in claim 16 wherein the conductive post includes a body with the top protrusion horizontally extending beyond a non-horizontal extent of the body, a horizontal width of the top protrusion greater than a horizontal width of the body.

20. The system as claimed in claim 16 wherein the conductive post includes a body and an interior protrusion, the body having a non-horizontal extent coplanar with a non-horizontal extent of the top protrusion, the interior protrusion having an interior protrusion top side coplanar with the top protrusion top side.

* * * * *